(12) United States Patent
Liu et al.

(10) Patent No.: US 9,261,792 B2
(45) Date of Patent: Feb. 16, 2016

(54) REFLECTIVE LITHOGRAPHY MASKS AND SYSTEMS AND METHODS

(71) Applicant: Taiwan Semiconductor Manufacturing Company, Ltd., Hsin-Chu (TW)

(72) Inventors: Chien-Hsuan Liu, Tainan (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/341,443

(22) Filed: Jul. 25, 2014

(65) Prior Publication Data

US 2014/0333914 A1    Nov. 13, 2014

Related U.S. Application Data

(62) Division of application No. 13/421,113, filed on Mar. 15, 2012, now Pat. No. 8,802,333.

(51) Int. Cl.
*G03F 7/20* (2006.01)
*G03F 1/52* (2012.01)
*G03F 1/24* (2012.01)

(52) U.S. Cl.
CPC .............. *G03F 7/70058* (2013.01); *G03F 1/24* (2013.01); *G03F 7/703* (2013.01); *G03F 7/70283* (2013.01); *G03F 1/52* (2013.01)

(58) Field of Classification Search
CPC .............. G03F 1/22; G03F 1/24; G03F 1/52; G03F 7/703; G03F 7/70283
USPC ............................................................ 430/5
See application file for complete search history.

(56) References Cited

U.S. PATENT DOCUMENTS

| | | | | |
|---|---|---|---|---|
| 4,891,830 A * | 1/1990 | Iwahashi | ............... | B82Y 10/00 378/34 |
| 5,344,729 A * | 9/1994 | Akins et al. | ........................ | 430/5 |
| 6,142,641 A | 11/2000 | Cohen et al. | | |
| 6,178,221 B1 | 1/2001 | Levinson et al. | | |
| 6,416,908 B1 * | 7/2002 | Klosner et al. | .................... | 430/5 |
| 8,802,333 B2 * | 8/2014 | Liu et al. | ........................... | 430/5 |
| 2008/0204694 A1 | 8/2008 | Shu et al. | | |
| 2009/0017387 A1 * | 1/2009 | Shoki | ............................... | 430/5 |
| 2009/0117494 A1 | 5/2009 | Owa | | |
| 2010/0015535 A1 | 1/2010 | Song et al. | | |
| 2013/0143007 A1 * | 6/2013 | Kim et al. | ................... | 428/195.1 |

FOREIGN PATENT DOCUMENTS

| | | |
|---|---|---|
| TW | 200933307 | 8/2009 |
| TW | 201107894 | 3/2011 |

* cited by examiner

*Primary Examiner* — Stewart Fraser
(74) *Attorney, Agent, or Firm* — Slater & Matsil, L.L.P.

(57) ABSTRACT

Various non-planar reflective lithography masks, systems using such lithography masks, and methods are disclosed. An embodiment is a lithography mask comprising a transparent substrate, a reflective material, and a reticle pattern. The transparent substrate comprises a curved surface. The reflective material adjoins the curved surface of the transparent substrate, and an interface between the reflective material and the transparent substrate is a reflective surface. The reticle pattern is on a second surface of the transparent substrate. A reflectivity of the reticle pattern is less than a reflectivity of the reflective material. Methods for forming similar lithography masks and for using similar lithography masks are disclosed.

20 Claims, 4 Drawing Sheets

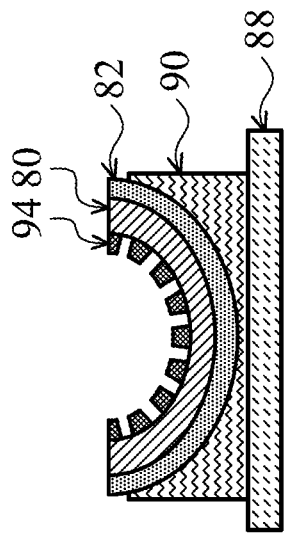
Fig. 7
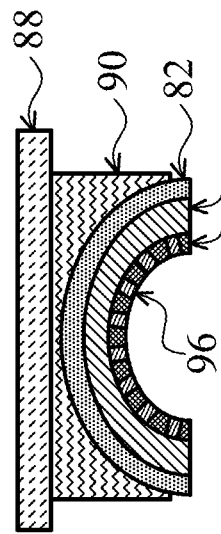
Fig. 8
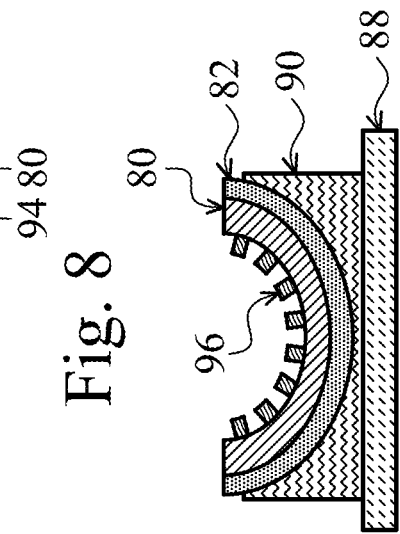
Fig. 9
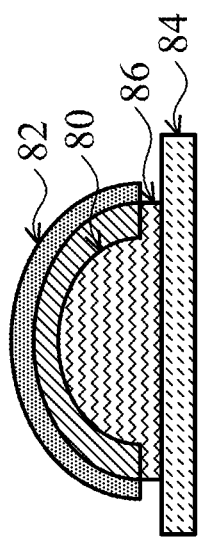
Fig. 4
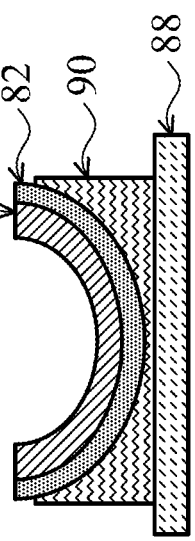
Fig. 5
Fig. 6

REFLECTIVE LITHOGRAPHY MASKS AND SYSTEMS AND METHODS

This application is a divisional of U.S. patent application Ser. No. 13/421,113, filed on Mar. 15, 2012, entitled "Reflective Lithography Masks and Systems and Methods," which application is hereby incorporated herein by reference in its entirety.

BACKGROUND

In semiconductor processing, multiple lithography steps are generally used to form a semiconductor chip. These steps typically include forming a photoresist over a substrate that is to be formed into the semiconductor chip, exposing the photoresist to a pattern of light generally controlled by a mask, developing the pattern in the photoresist to expose the underlying substrate, and etching the pattern in the underlying substrate. The pattern etched in the underlying substrate may be a basis for some feature formation, such as an ion impurity implantation such as for doping source and drain regions, a formation of a structure like a gate pattern, or a pattern for a conductive material such as in a metallization layer.

Advances in semiconductor processing have generally allowed for continued reduction of minimum feature sizes for semiconductor chips; however, each reduction in size typically is accompanied with its own challenges. As minimum feature size decreases, overlay concerns are typically intensified. Minimum feature size reduction allows for a greater density of features in a given area, which in turn increases the likelihood that an improperly overlaid feature can render the chip useless.

To help avoid improper overlaying of features, critical dimensions of features typically must be precise. If dimensions of features are just a small amount more than corresponding critical dimensions, the features can overlay other features. Accordingly, it is advantageous to form features with precise dimensions that are true to a design.

As previously noted, lithography steps are typically used to form these features, and at the source of the lithography steps is the mask. If the mask is not able to precisely form a pattern in a photoresist, the subsequently formed feature may not meet its critical dimension requirement. A cause for a mask not being able to precisely form a pattern may be that a source of the light is not properly oriented to the mask. This can cause a shadowing effect on a photoresist to be patterned. Further, a projection lens used in conjunction with a mask can be used multiple times with multiple masks. This extensive use of the projection lens can cause the projection lens to experience excessive heat. The excessive heat can alter physical properties of the projection lens leading to imprecise patterns in a photoresist.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 4 through 9 are an example of a method to form a non-planar mask according to an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely non-planar binary masks for photolithography. Other embodiments may also be applied, however, to other masks, such as a phase shift mask or the like. Throughout the various figures and discussion, like reference numbers refer to like components. Further, although described in a particular order, steps of various methods disclosed herein can be performed in any logical order.

Figure 1:
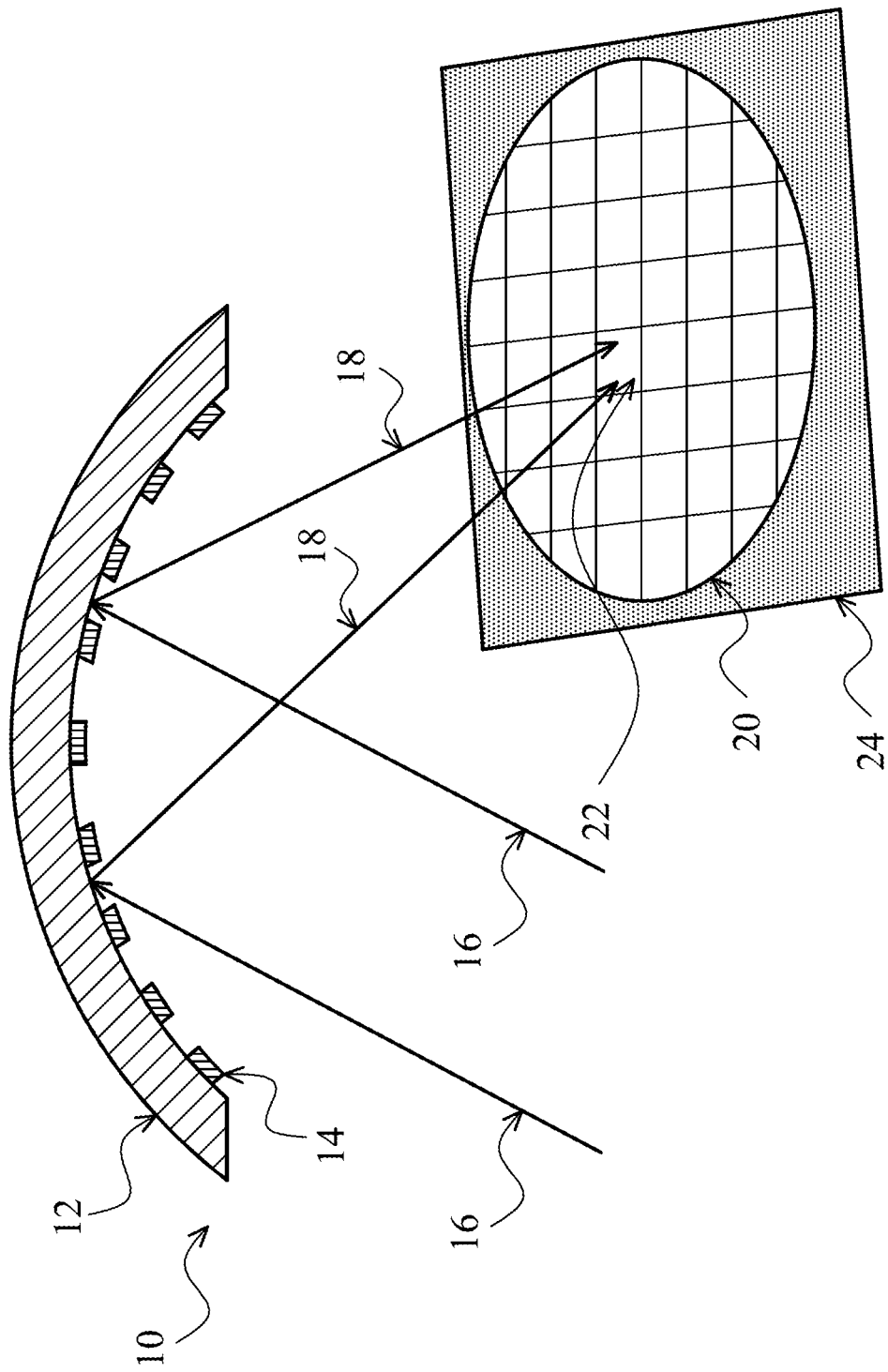
FIG. 1 is a non-planar mask and a system used in a lithography process according to an embodiment.

FIG. 1 illustrates a non-planar mask 10 and a system used in a lithography process according to an embodiment. The non-planar mask 10 comprises a reflective substrate 12, such as a substrate comprising a reflective surface, and a reticle pattern 14. The reflective substrate 12 in this embodiment has a curved reflective surface, such as a concave surface with a single focal point. The reticle pattern 14 is on a concave surface of the reflective substrate 12, which may or may not be the curved reflective surface. In other embodiments, the reticle pattern 14 can be on a planar or other surface of the reflective substrate 12. Other components used in the lithography process and/or in the system include an optical source (not specifically depicted), a wafer 20 that includes die areas and on which a photoresist is formed for patterning using the non-planar mask 10, and a wafer holder with stepper 24.

In an embodiment, the optical source provides optical radiation 16 for patterning the photoresist on the wafer 20. The non-planar mask 10 is disposed in an optical path of the optical radiation 16 generated by the optical source. The optical radiation 16 is reflected by the reflective substrate 12 of the non-planar mask 10 before impinging upon the photoresist on die area 22. As shown, the optical radiation 16 is focused as it is reflected by the reflective substrate 12 to create a reduced dimension optical radiation pattern 18 incident on the photoresist on the die area 22 on the wafer 20 on the wafer holder with stepper 24.

In this embodiment, the non-planar mask 10 is a binary mask. Some of the optical radiation 16 is incident upon the reflective surface of the reflective substrate 12. Other portions of the optical radiation 16 are incident upon the reticle pattern 14. The portion of the optical radiation 16 that is incident upon the reticle pattern 14 is generally not reflected sufficiently towards the wafer 20 to expose the photoresist, and the portion that is incident upon the reflective surface is reflected towards the die area 22 of the wafer 20 as the optical radiation pattern 18. The optical radiation pattern 18 reflected through the reticle pattern 14 defines a pattern to be produced in the photoresist.

As depicted in FIG. 1, the optical radiation pattern 18 is incident upon the die area 22. In embodiments, the wafer 20 is stepped such that each die area has the optical pattern incident upon the photoresist in that respective die area in subsequent respective steps. An appropriate wafer holder with stepper 24 can be used for stepping the wafer 20 through each exposure.

The optical pattern generally defines the pattern formed in the photoresist for a given die area. As an example, if the photoresist is a positive photoresist, the portion of the photoresist upon which the optical radiation pattern 18 is incident, e.g., is exposed, typically will become soluble and is generally removed. Thus, the exposure generally defines the areas in which photoresist is not present for a subsequent etch in the lithography process. As another example, if the photoresist is a negative photoresist, the portion of the photoresist exposed to the optical radiation pattern 18 typically will become insoluble and is generally is not removed for a subsequent process step. Thus, the exposure generally defines the areas in which photoresist is present for a subsequent etch in the lithography process.

Different configurations of the reflective substrate 12 are contemplated within different embodiments. For example, in an embodiment, the reflective substrate 12 can comprise a transparent substrate with a reflective material coated on a surface. The transparent substrate can be a meniscus type lens, such as one with a uniform thickness. The reflective material can be coated on the convex surface of the transparent substrate such that the interface between the reflective material and the transparent substrate is a reflective concave surface. The reticle pattern 14 can be on the concave surface of the transparent substrate. In another embodiment, the reflective substrate 12 can comprise any substrate with a concave surface and a reflective material coated on the concave surface of the substrate. The reticle pattern 14 can be on the reflective material such that the reflective material is disposed between the reticle pattern 14 and the substrate. In another embodiment, the reflective substrate 12 consists essentially of a reflective material with a concave surface upon which the reticle pattern 14 is formed. In embodiments where a transparent substrate is used and through which optical radiation, such as optical radiation 16, passes, the transparent substrate can be any lens type and may also provide for a degree of refraction of the optical radiation, such as the optical radiation 16 and/or the optical radiation pattern 18.

A person having ordinary skill in the art will readily appreciate that variations may be made to the system depicted in FIG. 1, which are contemplated within the scope of various embodiments. A projection lens may or may not be in the system, such as disposed in the path of the optical radiation 16 between the non-planar mask 10 and the optical source and/or disposed in the path of the optical radiation pattern 18 between the non-planar mask 10 and the wafer 20. For example, if the dimensions of the optical radiation pattern 18 are sufficient without a projection lens, the projection lens may be omitted. As another example, various radii of curvatures of the reflective surface can be used, and different distances and orientations between components can be used. Different radii, distances, and orientations may affect degrees of focus and reduction of dimension sizes of the optical pattern. Further, different materials may be used. The determination of appropriate radii of curvature, orientations and distances between components, and materials for a given application can be made without undue experimentation by a person having ordinary skill in the art.

Figure 2:
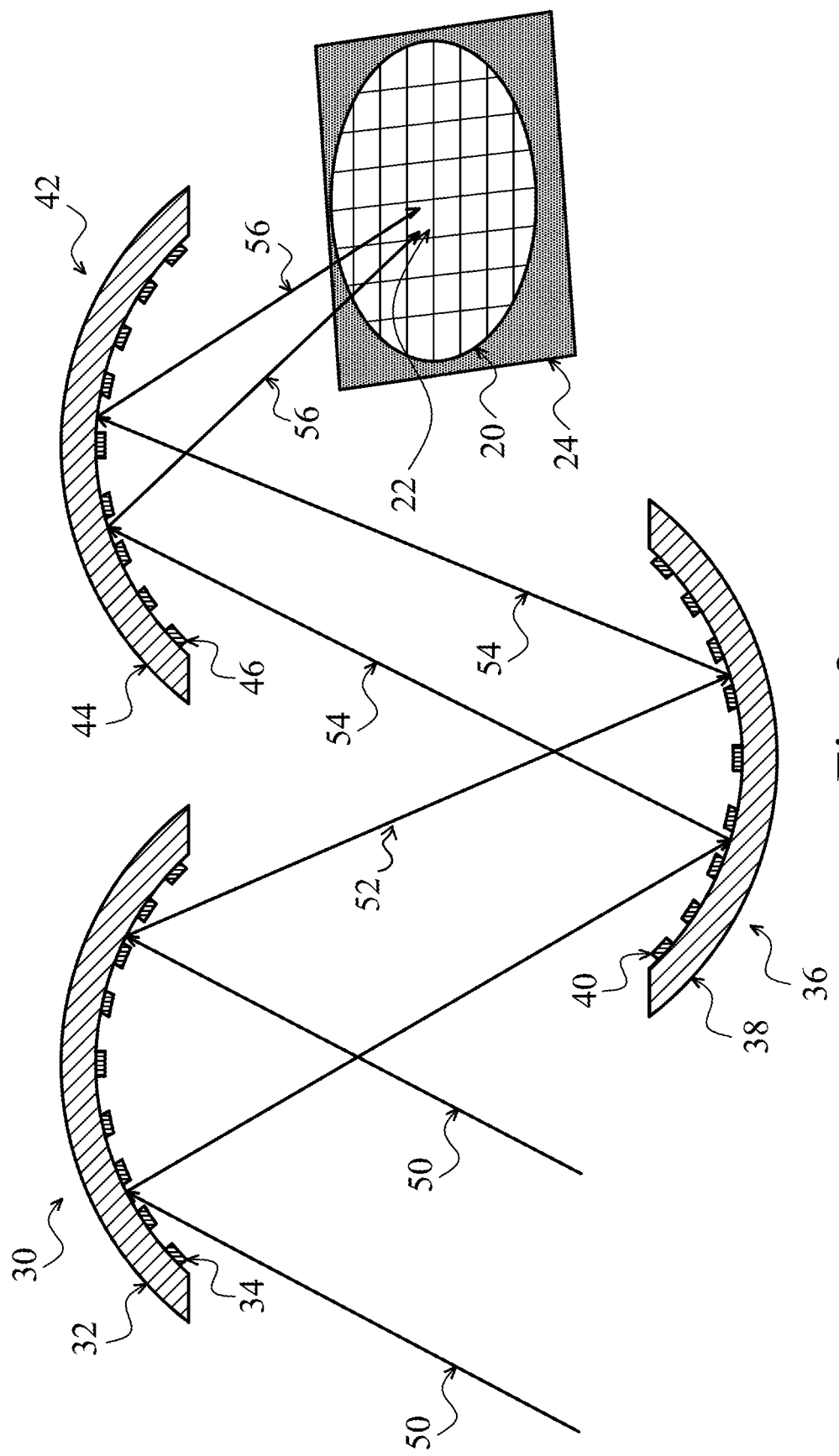
FIG. 2 is multiple non-planar masks and a system used in a lithography process according to another embodiment.

FIG. 2 illustrates multiple non-planar masks 30, 36, and 42 and a system used in a lithography process according to another embodiment. Each of the non-planar masks 30, 36, and 42 comprises a respective reflective substrate 32, 38, and 44 and a respective reticle pattern 34, 40, and 46. As depicted in FIG. 2, the reflective substrates 32, 38, and 44 each have a curved reflective surface, such as a concave surface with a single focal point. The reticle patterns 34, 40, and 46 are on a concave surface of the reflective substrates 32, 38, and 44, respectively, which may or may not be the curved reflective surface. In other embodiments, the reticle patterns 34, 40, and 46 can be on a planar or other surface of the reflective substrates 32, 38, and 44. Other components used in the lithography process and/or in the system include an optical source (not specifically depicted), a wafer 20 that includes die areas and on which a photoresist is formed for patterning using the non-planar mask 30, and a wafer holder with stepper 24.

The multiple non-planar masks 30, 36, and 42 are configured to direct optical radiation towards the die area 22. Optical radiation 50 from the optical source is directed towards the first non-planar mask 30, which reflects and focuses optical radiation 52. Optical radiation 52 is directed towards the second non-planar mask 36, which reflects and focuses optical radiation 54. Optical radiation 54 is directed towards the third non-planar mask 42, which reflects and focuses a reduced dimension optical radiation pattern 56. Optical radiation pattern 56 is incident upon the photoresist of the die area 22 on the wafer 20.

In this embodiment, the non-planar masks 30, 36, 42 are each a binary mask. The reticle patterns 34, 40, and 46 correspond to each other to produce the optical radiation pattern 56. Each of the reticle patterns 34, 40, and 46 can have a similar pattern, possibly considering any inversion of the optical signal that may occur between masks. In other embodiments, the reticle patterns 34, 40, and 46 may not necessarily correspond to each other, and each reticle pattern 34, 40, or 46 may provide an additional pattern that is not provided by another reticle pattern 34, 40, or 46. In other embodiments, a reflective surface(s) can be in an optical path without a reticle pattern.

In the embodiment of FIG. 2, some of the optical radiation 50 is incident upon the reflective surface of the reflective substrate 32. Other portions of the optical radiation 50 are incident upon the reticle pattern 34. The portion of the optical radiation 50 that is incident upon the reticle pattern 34 is generally not reflected towards the second non-planar mask 36, and the portion that is incident upon the reflective surface is reflected as focused optical radiation 52 towards the second non-planar mask 36. Similarly, some of the optical radiation 52 is incident upon the reflective surface of the reflective substrate 38. Other portions of the optical radiation 52 may be incident upon the reticle pattern 40. The portion of the optical radiation 52 that may be incident upon the reticle pattern 40 is generally not reflected towards the third non-planar mask 42, and the portion that is incident upon the reflective surface is reflected as focused optical radiation 54 towards the third non-planar mask 42. Further, some of the optical radiation 54 is incident upon the reflective surface of the reflective substrate 44. Other portions of the optical radiation 54 may be incident upon the reticle pattern 46. The portion of the optical radiation 54 that may be incident upon the reticle pattern 46 is generally not reflected sufficiently towards the wafer 20 to expose the photoresist, and the portion that is incident upon the reflective surface is reflected as optical radiation pattern 56 towards the die area 22 of the wafer 20. The optical radiation pattern 56 defines a pattern to be produced in the photoresist.

As depicted in FIG. 2, the optical radiation pattern 56 is incident upon the die area 22. In embodiments, the wafer 20 is stepped such that each die area has the optical pattern incident upon the photoresist in that respective die area in subsequent respective steps. An appropriate wafer holder with stepper 24 can be used for stepping the wafer 20 through each exposure.

A person having ordinary skill in the art will readily understand modifications to the system of FIG. 2, which are contemplated within the scope of different embodiments. The example modifications previously discussed for the reflective substrate 12 in FIG. 1 can also be applied to the reflective substrates 32, 38, and 44 in FIG. 2. A projection lens may or may not be in the system, such as disposed in any of the paths of the optical radiation. Additional or fewer reflective substrates can be used. Further, different distances and orientations between components can be used. Different radii, distances, and orientations may affect degrees of focus of the optical pattern. The determination of appropriate radii of curvature and orientations and distances between components for a given application can be made without undue experimentation by a person having ordinary skill in the art.

Figure 3:
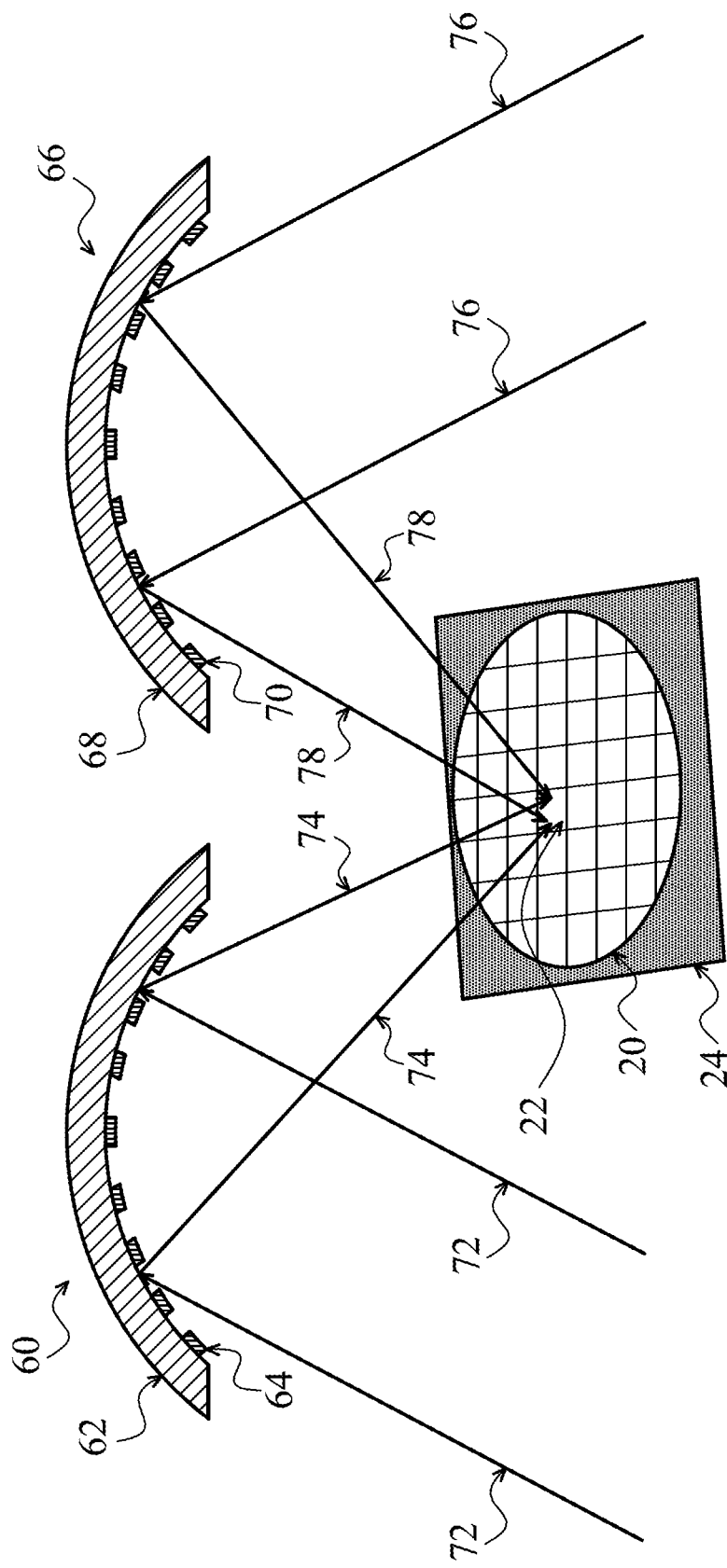
FIG. 3 is multiple non-planar masks with multiple optical sources and a system used in a lithography process according to yet another embodiment.

FIG. 3 illustrates multiple non-planar masks 60 and 66 with multiple optical sources (not specifically depicted) and a system used in a lithography process according to another embodiment. Each of the non-planar masks 60 and 66 comprises a respective reflective substrate 62 and 68 and a respective reticle pattern 64 and 70. As depicted in FIG. 3, the reflective substrates 62 and 68 each have a curved reflective surface, such as a concave surface with a single focal point. The reticle patterns 64 and 70 are on concave surfaces of the respective reflective substrates 62 and 68, respectively, which may or may not be the curved reflective surfaces. In other embodiments, the reticle patterns 64 and 70 can be on a planar or other surfaces of the reflective substrates 62 and 68. Other components used in the lithography process and/or in the system include first and second optical sources (not specifically depicted), a wafer 20 that includes die areas and on which a photoresist is formed for patterning using the non-planar masks 60 and 66, and a wafer holder with stepper 24.

Each of the multiple non-planar masks 60 and 66 are configured to direct different optical radiation towards the die area 22. Optical radiation 72 from the first optical source is directed towards the first non-planar mask 60, which reflects and focuses a reduced dimension optical radiation pattern 74. Optical radiation 76 from the second optical source is directed towards the second non-planar mask 66, which reflects and focuses a reduced dimension optical radiation pattern 78. Optical radiation patterns 74 and 78 are incident upon the photoresist of the die area 22 on the wafer 20.

In this embodiment, the non-planar masks 60 and 66 are each a binary mask. Each of the reticle patterns 64 and 70 can have a same or similar pattern. In other embodiments, the reticle patterns 64 and 70 may not necessarily correspond to each other, but each reticle pattern 64 or 70 may provide an additional pattern that is not provided by the other reticle pattern 64 or 70.

In the embodiment of FIG. 3, some of the optical radiation 72 from the first optical source is incident upon the reflective surface of the reflective substrate 62. Other portions of the optical radiation 72 are incident upon the reticle pattern 64. The portion of the optical radiation 72 that is incident upon the reticle pattern 64 is generally not reflected sufficiently towards the wafer 20 to expose the photoresist, and the portion that is incident upon the reflective surface is reflected as a reduced dimension optical radiation pattern 74 towards the die area 22 on the wafer 20. Similarly, some of the optical radiation 76 from the second optical source is incident upon the reflective surface of the reflective substrate 68. Other portions of the optical radiation 76 are incident upon the reticle pattern 70. The portion of the optical radiation 76 that is incident upon the reticle pattern 70 is generally not reflected sufficiently towards the wafer 20 to expose the photoresist, and the portion that is incident upon the reflective surface is reflected as a reduced dimension optical radiation pattern 78 towards the die area 22 on the wafer 20. The optical radiation patterns 74 and 78 define a pattern to be produced in the photoresist. Having multiple optical radiation patterns being incident on the photoresist may reduce shadowing effects that may be present when a single optical radiation pattern is incident upon the photoresist.

As depicted in FIG. 3, the optical radiation patterns 74 and 78 are incident upon the die area 22. In embodiments, the wafer 20 is stepped such that each die area has the optical pattern incident upon the photoresist in that respective die area in subsequent respective steps. An appropriate wafer holder with stepper 24 can be used for stepping the wafer 20 through each exposure.

A person having ordinary skill in the art will readily understand modifications to the system of FIG. 3, which are contemplated within the scope of different embodiments. The example modifications previously discussed for the reflective substrate 12 in FIG. 1 can also be applied to the reflective substrates 62 and 68 in FIG. 3. A projection lens may or may not be in the system, such as disposed in any of the paths of the optical radiation. Additional or fewer reflective substrates can be used. Further, different distances and orientations between components can be used. Different radii, distances, and orientations may affect degrees of focus of the optical pattern. The determination of appropriate radii of curvature and orientations and distances between components for a given application can be made without undue experimentation by a person having ordinary skill in the art.

FIGS. 4 through 9 illustrate an example of a method to form a non-planar mask according to an embodiment. In FIG. 4, a non-planar transparent substrate 80 is provided. A meniscus type substrate is illustrated in this example method, although other lens type substrates can be used. The transparent substrate 80 in this example is glass, and in other embodiments, the transparent substrate 80 can be quartz, borosilicate, mylar, soda-lime glass, or the like.

The transparent substrate 80 is adhered to a first handle substrate 84 using, for example, an epoxy 86 to ease handling of the transparent substrate 80. The concave surface of the transparent substrate 80 is adhered to the epoxy 86 with the convex surface of the transparent substrate 80 being exposed. A reflective material 82 is coated on the convex surface of the transparent substrate 80. The reflective material 82 can be formed, for example, by coating the transparent substrate 80 with tin(II) chloride, silver or aluminum, a chemical activator, copper, and a paint. Other reflective material(s) can also be used. The reflective material 82 can be formed using acceptable coating techniques. The reflective material 82 has a curved reflective surface, such as a concave reflective surface, at the interface between the reflective material 82 and the transparent substrate 80.

In FIG. 5, the transparent substrate 80 and reflective material 82 are adhered to a second handle substrate 88 using, for example, an epoxy 90 to ease handling of the transparent substrate 80. A convex surface of the reflective material 82 is adhered to the epoxy 90. The convex surface of the transparent substrate 80 is disposed proximate the epoxy 90 with the concave surface of the transparent substrate 80 being distal from the epoxy 90 and being exposed after removal of the first handle substrate 84 and the epoxy 86.

In FIG. 6, a photoresist 92 is formed on the concave surface of the transparent substrate 80. The photoresist 92 is applied using, for example, spin on deposition. The photoresist 92 can be any acceptable photoresist material. In FIG. 7, the photoresist 92 is patterned to form a patterned photoresist 94. The photoresist 92 is patterned using exposure by a laser. Other embodiments contemplate other acceptable exposure techniques, such as an e-beam exposure. The photoresist 92 is baked and developed to form the patterned photoresist 94. As will become apparent, the patterned photoresist 94 is an inverse pattern of a finished reticle pattern.

In FIG. 8, a reticle pattern 96 is formed on the concave surface of the transparent substrate 80 in the openings of the patterned photoresist 94. The reticle pattern 96 is a material that has a reflectivity less than the reflectivity of the reflective material 82. In this embodiment, the reticle pattern 96 comprises silver emulsion, chromium, iron oxide, aluminum, the like, or a combination thereof. The reticle pattern 96 is deposited using, for example, thermal evaporation. Other deposition processes may also be used. In FIG. 9, the patterned photoresist 94 is removed, for example, by an acceptable ashing process. The formed non-planar mask can then be removed from the second handle substrate 88 and the epoxy 90 and used in a photolithography system, such as depicted in FIGS. 1 through 3.

Embodiments can achieve advantages. Using a non-planar mask in a photolithography process can reduce the dimensions of a pattern of a photoresist on a wafer surface. By having a curved reflective surface, the focus of an optical pattern can be easily controlled. Further, a non-planar mask may obviate a need for a projection lens. In known processes, a projection lens may be excessively heated through continued use during different photoresist patterning steps. With an embodiment, a specific mask may be used for only one patterning process, which may allow the mask to not be excessively heated and be cooled during other patterning processes. This can prevent some irregularities in the patterning process that may otherwise occur with thermal expansion of a projection lens which can affect the refraction and focus of light.

A first embodiment is a system comprising a first radiation source and a first lithography mask. The first lithography mask comprises a first non-planar reflective surface. The first lithography mask is configured to reflect radiation, by the first non-planar reflective surface, from the radiation source in a first pattern of radiation to a substrate.

Another embodiment is a lithography mask comprising a transparent substrate, a reflective material, and a reticle pattern. The transparent substrate comprises a curved surface. The reflective material adjoins the curved surface of the transparent substrate, and an interface between the reflective material and the transparent substrate is a reflective surface. The reticle pattern is on a second surface of the transparent substrate. A reflectivity of the reticle pattern is less than a reflectivity of the reflective material.

A further embodiment is a method for lithography. The method comprises projecting first radiation from a first radiation source; reflecting a first pattern of the first radiation using a first lithography mask, the first lithography mask comprising a first curved reflective surface with a single focal point and comprising a first reticle pattern; and impinging the first pattern of the first radiation on an area of a substrate.

A yet further embodiment is a method for forming a lithography mask. The method comprises providing a transparent substrate having a curved surface; forming a reflective material adjoining the curved surface of the transparent substrate; and forming a reticle pattern on a surface of the transparent substrate, the reticle pattern comprising a material with a lower reflectivity than a reflectivity of the reflective material.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system comprising:
a first radiation source; and
a first lithography mask comprising a first non-planar reflective surface and a first reticle pattern, the first lithography mask being configured to reflect radiation off of the first non-planar reflective surface in a first pattern of radiation to a substrate, the radiation being from the first radiation source, the first pattern of radiation corresponding to the first reticle pattern.

2. The system of claim 1, wherein the first non-planar reflective surface has a single focal point.

3. The system of claim 1, wherein the first non-planar reflective surface is a concave surface.

4. The system of claim 1, wherein the first reticle pattern is on a second non-planar surface of the first lithography mask.

5. The system of claim 1, wherein the first lithography mask comprises:
a transparent substrate with a convex surface, the first reticle pattern being on a second surface of the transparent substrate; and
a reflective material on the convex surface of the transparent substrate, an interface between the convex surface of the transparent substrate and the reflective material being the first non-planar reflective surface.

6. The system of claim 1 further comprising a second lithography mask comprising a second non-planar reflective surface, the second lithography mask being configured to reflect radiation from the first radiation source to the first lithography mask, the first lithography mask being configured to reflect the radiation in the first pattern of radiation to the substrate.

7. The system of claim 1 further comprising:
a second radiation source; and
a second lithography mask comprising a second non-planar reflective surface, the second lithography mask being configured to reflect radiation from the second radiation source in a second pattern of radiation to the substrate.

8. A lithography mask comprising:
a transparent substrate comprising a curved surface;
a reflective material adjoining the curved surface of the transparent substrate, an interface between the reflective material and the transparent substrate being a reflective surface; and
a reticle pattern adjoining a second surface of the transparent substrate, the second surface of the transparent substrate being opposite from the curved surface of the transparent substrate, a reflectivity of the reticle pattern being less than a reflectivity of the reflective material.

9. The lithography mask of claim 8, wherein the reflective surface has a single focal point.

10. The lithography mask of claim 8, wherein the reflective surface is a concave surface.

11. The lithography mask of claim 8, wherein the transparent substrate is a meniscus type lens having a uniform thickness.

12. The lithography mask of claim 8, wherein the second surface of the transparent substrate is a non-planar surface.

13. The lithography mask of claim 8, wherein the second surface of the transparent substrate is a concave surface.

14. A system comprising:
   a first radiation source configured to project first optical radiation;
   a first lithography mask having a first curved reflective surface and a first reticle pattern; and
   a substrate holder configured to secure a substrate, the first lithography mask being configured to reflect the first optical radiation from the first radiation source off of the first curved reflective surface towards the substrate holder in a first optical pattern, the first optical pattern corresponding to the first reticle pattern.

15. The system of claim 14, wherein the first curved reflective surface has a single focal point.

16. The system of claim 14, wherein the first curved reflective surface is a concave surface.

17. The system of claim 14, wherein the first reticle pattern is on a second curved surface of the first lithography mask opposite from the first curved reflective surface.

18. The system of claim 14 further comprising a second lithography mask having a second curved reflective surface, the second lithography mask being configured to reflect the first optical radiation from the first radiation source towards the first lithography mask.

19. The system of claim 14 further comprising:
   a second radiation source configured to project second optical radiation; and
   a second lithography mask having a second curved reflective surface and a second reticle pattern, the second lithography mask being configured to reflect the second optical radiation from the second radiation source off of the second curved reflective surface towards the substrate holder in a second optical pattern, the second optical pattern corresponding to the second reticle pattern.

20. The system of claim 14, wherein the first lithography mask comprises:
   a transparent substrate, the first reticle pattern adjoining the transparent substrate; and
   a reflective material adjoining the transparent substrate on a side opposite from the first reticle pattern, an interface between the reflective material and the transparent substrate being the first curved reflective surface, a reflectivity of the first reticle pattern being less than a reflectivity of the reflective material.

* * * * *